US012677491B2

(12) United States Patent
Cheng et al.

(10) Patent No.: US 12,677,491 B2
(45) Date of Patent: *Jul. 7, 2026

(54) LIGHT SENSING DEVICE WITH DIELECTRIC ELEMENT NEXT TO FILTER ELEMENT

(71) Applicant: Taiwan Semiconductor Manufacturing Company, Ltd., Hsinchu (TW)

(72) Inventors: Yun-Wei Cheng, Taipei City (TW); Yi-Hsing Chu, Tainan City (TW); Yin-Chieh Huang, Tainan City (TW); Chun-Hao Chou, Tainan City (TW); Kuo-Cheng Lee, Tainan City (TW); Hsun-Ying Huang, Tainan City (TW); Hsin-Chi Chen, Tainan City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 591 days.

This patent is subject to a terminal disclaimer.

(21) Appl. No.: 17/554,275

(22) Filed: Dec. 17, 2021

(65) Prior Publication Data

US 2022/0109019 A1 Apr. 7, 2022

Related U.S. Application Data

(60) Continuation of application No. 16/867,997, filed on May 6, 2020, now Pat. No. 11,233,082, which is a division of application No. 16/391,009, filed on Apr. 22, 2019, now Pat. No. 10,651,217, which is a division of application No. 15/634,148, filed on Jun. 27, 2017, now Pat. No. 10,269,844.

(51) Int. Cl.
*H10F 39/00* (2025.01)

(52) U.S. Cl.
CPC ....... *H10F 39/8053* (2025.01); *H10F 39/024* (2025.01); *H10F 39/8057* (2025.01); *H10F 39/8067* (2025.01)

(58) Field of Classification Search
CPC ......... H01L 27/14621; H01L 27/14623; H01L 27/14629; H01L 27/14685; H01L 27/14625; H10F 39/8053; H10F 39/8057; H10F 39/024; H10F 39/8067; H10F 39/806
See application file for complete search history.

(56) References Cited

U.S. PATENT DOCUMENTS 9,130,072 B1 * 9/2015 Chen ..................... H10F 39/199
9,373,732 B2 6/2016 Velichko
9,497,366 B1 11/2016 Boettiger et al.
(Continued)

*Primary Examiner* — Jennifer D Bennett
(74) *Attorney, Agent, or Firm* — Birch, Stewart, Kolasch & Birch, LLP

(57) ABSTRACT

A light sensing device is provided. The light sensing device includes a semiconductor substrate and a light sensing region in the semiconductor substrate. The light sensing device also includes a filter element over the light sensing region and a light shielding element over the semiconductor substrate and beside the filter element. The light sensing device further includes a dielectric element over the light shielding element and beside the filter element. A top of the light shielding element and a bottom of the dielectric element have different widths.

20 Claims, 13 Drawing Sheets

(56) References Cited

U.S. PATENT DOCUMENTS

| | | | |
|---|---|---|---|
| 9,786,704 B2 | 10/2017 | Cheng et al. | |
| 9,991,302 B1 * | 6/2018 | Lin | H01L 31/02162 |
| 10,269,844 B2 * | 4/2019 | Cheng | H01L 27/14623 |
| 10,651,217 B2 * | 5/2020 | Cheng | H01L 27/14629 |
| 2006/0163451 A1 | 7/2006 | Park et al. | |
| 2006/0275944 A1 | 12/2006 | Hyun | |
| 2007/0188635 A1 | 8/2007 | Yamaguchi et al. | |
| 2009/0314743 A1 | 12/2009 | Ma | |
| 2010/0245637 A1 | 9/2010 | Itonaga | |
| 2011/0031517 A1 | 2/2011 | Huang et al. | |
| 2011/0298074 A1 * | 12/2011 | Funao | H10F 39/8023 |
| | | | 257/432 |
| 2012/0200749 A1 | 8/2012 | Boettiger et al. | |
| 2012/0235266 A1 | 9/2012 | Ootsuka | |
| 2012/0273906 A1 | 11/2012 | Mackey et al. | |
| 2014/0313379 A1 | 10/2014 | Mackey | |
| 2015/0130001 A1 * | 5/2015 | Cheng | H01L 27/14627 |
| | | | 438/70 |
| 2016/0141321 A1 | 5/2016 | Hsieh et al. | |
| 2016/0276394 A1 * | 9/2016 | Chou | H01L 27/14636 |
| 2017/0025458 A1 * | 1/2017 | Lin | H01L 27/14645 |
| 2017/0077157 A1 | 3/2017 | Cheng et al. | |
| 2017/0098675 A1 | 4/2017 | Chien et al. | |
| 2017/0170238 A1 | 6/2017 | Lee et al. | |
| 2018/0076247 A1 * | 3/2018 | Pang | H10F 39/8063 |
| 2018/0301491 A1 | 10/2018 | Nakamoto et al. | |
| 2019/0088704 A1 * | 3/2019 | Jang | H01L 27/14685 |

* cited by examiner

313

314

313

314

902

LIGHT SENSING DEVICE WITH DIELECTRIC ELEMENT NEXT TO FILTER ELEMENT

PRIORITY CLAIM AND CROSS-REFERENCE

This application is a Continuation application of U.S. patent application Ser. No. 16/867,997, filed on May 6, 2020, which is a Divisional of U.S. application Ser. No. 16/391,009, filed on Apr. 22, 2019, which is a Divisional of U.S. application Ser. No. 15/634,148, filed on Jun. 27, 2017, the entirety of which are incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

Along with the advantages gained from reducing geometric size, improvements are being made directly to IC devices. One such IC device is an image sensor device. It is desirable to form image sensor devices with improved performance and reliability.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
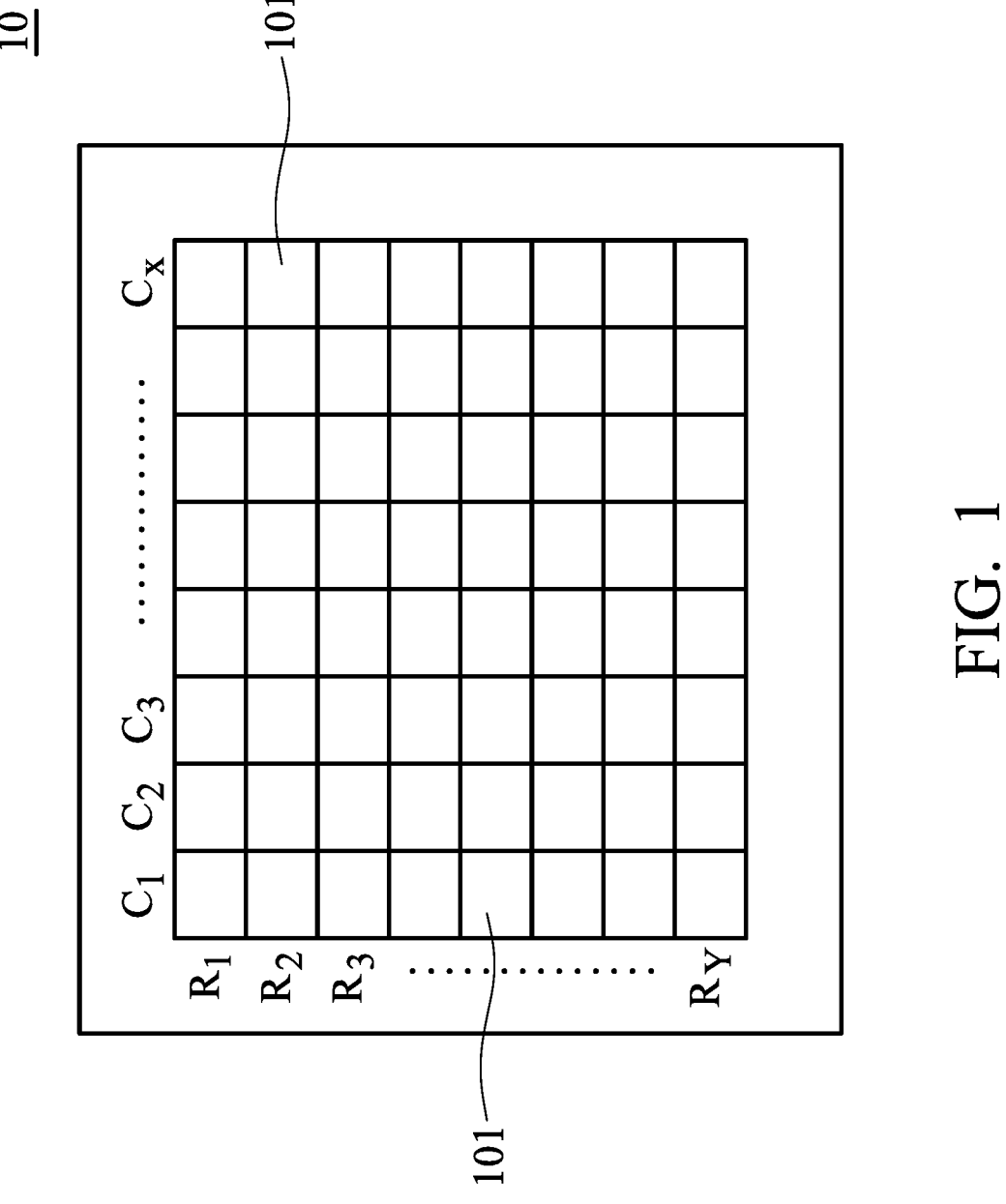
FIG. 1 is a top view of a light sensing device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIG. 1 is a top view of a light sensing device 10, in accordance with some embodiments. The light sensing device 10 may be a backside illuminated (BSI) image sensor device. However, it should be appreciated that embodiments of the disclosure are not limited to being the BSI image sensor device. In some other embodiments, the light sensing device 10 is a front side illuminated (FSI) image sensor device. In some other embodiments, the light sensing device 10 is used to sense invisible light.

In some embodiments, the light sensing device 10 includes an array of pixel regions 101. The pixel regions 101 may be arranged into columns (for example, $C_1$ to $C_X$) and rows (for example, $R_1$ to $R_Y$). The term "pixel region" refers to a unit cell containing features such as photodetector and various circuitry. The unit cell may include various semiconductor devices for converting electromagnetic radiation into an electrical signal. The photodetectors (or light sensing regions) in the pixel regions 101 may include photodiodes, complimentary metal-oxide-semiconductor (CMOS) image sensors, charged coupling device (CCD) sensors, active sensors, passive sensors, one or more other applicable sensors, or a combination thereof.

The pixel regions 101 may be designed with a single sensor type. Alternatively, the pixel regions 101 may be designed with various sensor types. One group of pixel regions 101 may be CMOS image sensors, and another group of pixel regions 101 may be other types of sensors, such as passive sensors. In some embodiments, each pixel region 101 includes a photodetector, such as a photogate-type photodetector, for recording intensity or brightness of light (radiation). Each pixel region 101 may also include various semiconductor devices, such as various transistors.

Additional circuitry, inputs, and/or outputs may be formed in a peripheral region or other suitable regions of the light sensing device 10 and be coupled to the pixel regions 101. For example, the circuitry in the peripheral region provides an operation environment for the pixel regions 101 and support communications with the pixel regions 101.

Figure 2:
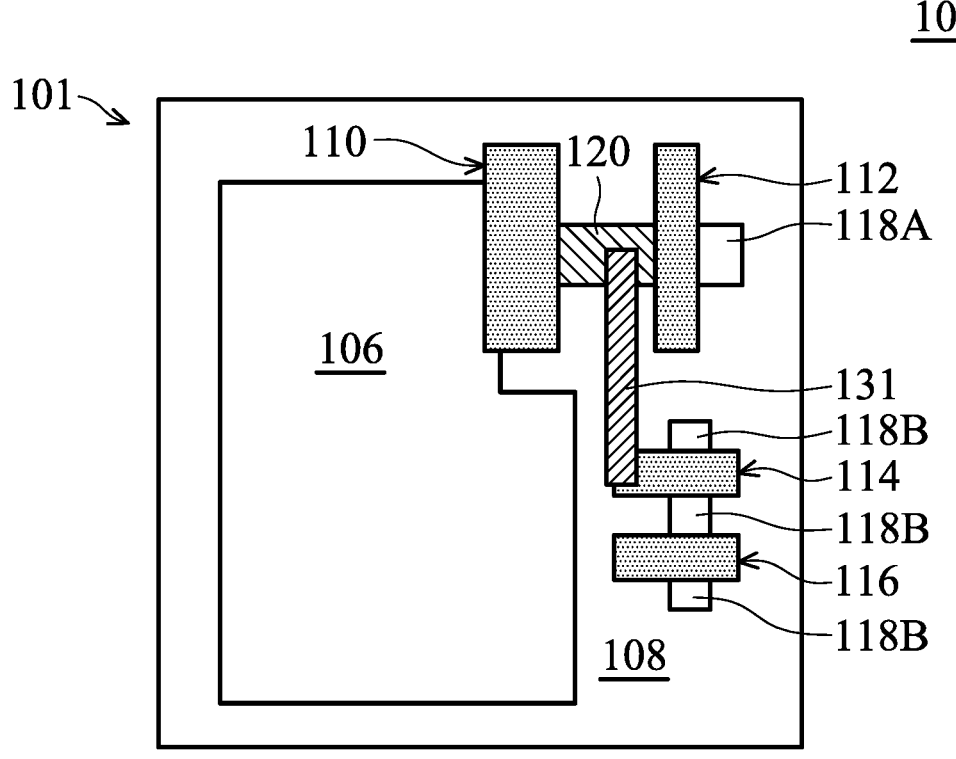
FIG. 2 is a top view of a pixel region of a light sensing device, in accordance with some embodiments.

FIG. 2 is a top view of one of the pixel regions 101 of the light sensing device 10, in accordance with some embodiments. As shown in FIG. 2, the pixel region 101 includes a light sensing region 106. In some embodiments, the light sensing region 106 is used for detecting intensity or brightness of light (radiation). The pixel region 101 may contain various transistors. For example, the transistors include a transfer transistor 110, a reset transistor 112, a source-follower transistor 114, a select transistor 116, one or more other suitable transistors, or a combination thereof.

The pixel region 101 may also include various doped regions in the semiconductor substrate, such as doped regions 118A, 118B, and 120. The doped regions 118A, 118B, and 120 serve as source/drain regions of the previously mentioned transistors. The doped region 120 is also referred to as a floating diffusion region in some embodiments. The doped region 120 is between the transfer transistor 110 and the reset transistor 112, and is one of the source/drain regions for the transfer transistor 110 and the reset transistor 112. In some embodiments, a conductive feature 131 overlaps a portion of a gate stack of the source-follower transistor 114 and connects to the doped region 120.

The light sensing device 10 may also include various isolation structures 108 formed in the semiconductor substrate to isolate various regions of the semiconductor substrate. The isolation structures 108 prevent leakage currents between various regions. In some embodiments, the isolation structures 108 include dielectric isolation structures. The dielectric isolation structures may be formed by using a shallow trench isolation (STI) technique, a deep trench isolation (DTI) technique, one or more other applicable techniques, or a combination thereof.

In some embodiments, the isolation structures 108 may include doped isolation structures formed by an implantation technique or a diffusion technique. In some embodiments, the isolation structures 108 are formed in the pixel region 101 to isolate the light sensing region 106, the transfer transistor 110, the reset transistor 112, the source-follower transistor 114, and the select transistor 116.

The light sensing device 10 further includes a color filter and a lens disposed over a back surface of the semiconductor substrate in some embodiments. The color filter and the lens may be aligned with the light sensing region 106. The lens is used to direct or focus the incident light. The color filter is designed so that it filters through light of a predetermined wavelength band. For example, the color filter may filter through visible light of a red wavelength band, a green wavelength band, a blue wavelength band, or a near-infrared wavelength band to the light sensing region 106.

In the operation of the light sensing device 10 according to some embodiments, the light sensing device 10 is designed to receive radiation traveling towards the back surface of a semiconductor substrate of the light sensing device 10. The lens disposed over the back surface of the semiconductor substrate directs the incident radiation to the corresponding light sensing region 106 in the semiconductor substrate. The incident radiation may generate electron-hole pairs. When exposed to the incident radiation, the light sensing region 106 responds to the incident radiation by accumulating electrons. The holes may be trapped by a doped layer over the back surface of the semiconductor substrate to prevent the recombination of the electrons and the holes.

The electrons are transferred from the light sensing region 106 to the doped region 120 when the transfer transistor 110 is turned on. Through the connection of the conductive feature 131, the source-follower transistor 114 may convert the electrons from the doped region 120 to voltage signals. The select transistor 116 may allow a single row (or a single column) of the pixel array to be read by read-out electronics. The reset transistor 112 may act as a switch to reset the doped region 120. When the reset transistor 112 is turned on, the doped region 120 is connected to a power supply to clear all accumulated electrons.

It should be appreciated that embodiments of the disclosure are not limited to being the light sensing device 10 shown in FIG. 1 or 2. In some other embodiments, the light sensing device 10 includes different configurations.

Figure 3A:
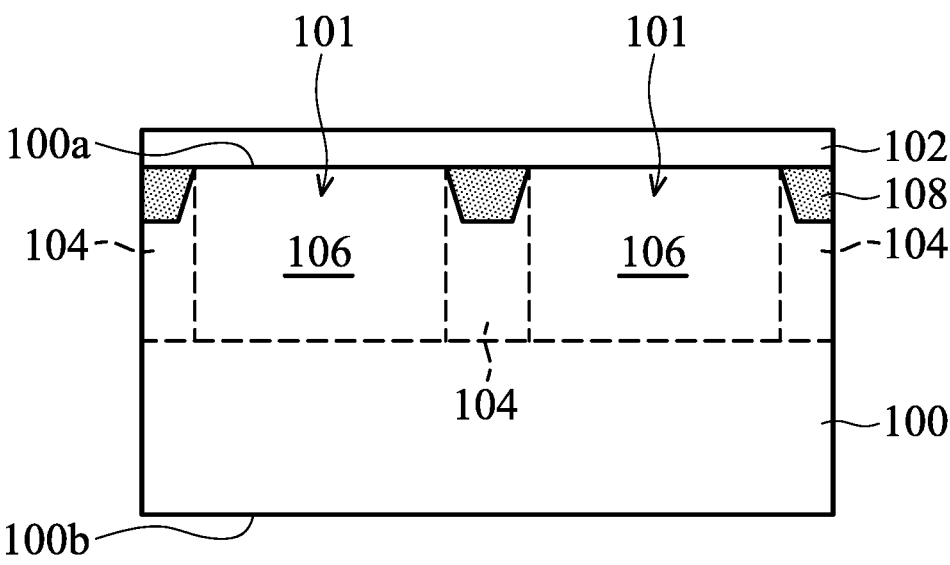
FIGS. 3A-3H are cross-sectional views of various stages of a process for forming a light sensing device, in accordance with some embodiments.

FIGS. 3A-3H are cross-sectional views of various stages of a process for forming a light sensing device, in accordance with some embodiments. Referring to FIG. 3A, a semiconductor substrate 100 is received or provided. The semiconductor substrate 100 has a front surface 100a and a back surface 100b. In some embodiments, the semiconductor substrate 100 is defined to mean a construction comprising one or more semiconductor materials. In some embodiments, the semiconductor substrate 100 includes a semiconductor wafer (such as a silicon wafer), or a portion of a semiconductor wafer. In some embodiments, the semiconductor substrate 100 includes an elementary semiconductor material in a single crystal, polycrystal, or amorphous structure. The elementary semiconductor material may include silicon, germanium, or another suitable material.

In some other embodiments, the semiconductor substrate 100 includes a compound semiconductor, such as silicon carbide, gallium arsenide, gallium phosphide, indium phosphide, indium arsenide, an alloy semiconductor, such as SiGe, GaAsP, AlInAs, AlGaAs, GaInAs, GaInP, GaInAsP, one or more other suitable materials, or a combination thereof.

In some embodiments, the semiconductor substrate 100 includes multi-layer semiconductors, a semiconductor on insulator (SOI) (such as silicon on insulator or germanium on insulator), or a combination thereof. In some embodiments, the semiconductor substrate 100 is a chip, such as a chip containing light sensing devices.

As shown in FIG. 3A, the semiconductor substrate 100 includes one or more isolation structures 108, in accordance with some embodiments. The isolation structures 108 may define and/or isolate various device elements formed in the semiconductor substrate 100. The isolation structures 108 include shallow trench isolation (STI) features, deep trench isolation (DTI) features, local oxidation of silicon (LOCOS) features, other suitable isolation structures, or a combination thereof.

In some embodiments, the isolation structures 108 are made of or include silicon oxide, silicon nitride, silicon oxynitride, fluoride-doped silicate glass (FSG), a low-K dielectric material, one or more other suitable materials, or a combination thereof. In some embodiments, the formation of the isolation structure 108 includes patterning the semiconductor substrate 100 by a photolithography process, etching a recess, such as a trench, in the semiconductor substrate 100, and filling the recess with one or more dielectric materials. In some embodiments, the filled trench has a multi-layer structure, such as a thermal oxide liner layer filled with silicon nitride or silicon oxide.

Examples of the various device elements, which may be formed in the semiconductor substrate 100, include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n-channel field effect transistors (PFETs/NFETs), etc.), diodes, other applicable elements, or a combination thereof. In some embodiments, similar to the embodiments shown in FIG. 2, the various device elements include the transfer transistor 110, the reset transistor 112, the source-follower transistor 114, the select transistor 116, one or more other suitable device elements, or a combination thereof. Various processes are performed to form the various device elements, which include, for example, deposition, photolithography, etching, implantation, annealing, planarization, and/or other suitable processes.

As shown in FIG. 3A, multiple light sensing regions 106 are formed in the semiconductor substrate 100, in accordance with some embodiments. As shown in FIG. 3A, the isolation structures 108 separate the adjacent light sensing regions 106. In some embodiments, each of the light sensing regions 106 is formed by using ion implantation processes, diffusion processes, one or more other applicable processes, or a combination thereof.

As shown in FIG. 3A, isolation regions 104 are formed in the semiconductor substrate 100, in accordance with some embodiments. The isolation regions 104 are used to electrically separate the adjacent light sensing regions 106. In some embodiments, the isolation regions 104 are doped regions, such as (but not limited to) p-type doped regions. The isolation regions 104 may also refer to doped isolation regions. In some embodiments, the isolation regions 104 are formed by using ion implantation processes, diffusion processes, one or more other applicable processes, or a combination thereof. In some embodiments, the isolation regions 104 are formed before the isolation structures 108. In some other embodiments, the isolation regions 104 are formed after the isolation structures 108. In some embodiments, each of the isolation structures 108 is surrounded by one of the isolation regions 104.

As shown in FIG. 3A, an interconnect structure 102 is formed over the front surface 100a of the semiconductor substrate 100, in accordance with some embodiments. In some embodiments, the interconnect structure 102 includes a stack of multiple dielectric layers. The interconnect structure 102 also includes various conductive features. The conductive features include, for example, multiple horizontal interconnects, such as conductive lines, and multiple vertical interconnects, such as conductive via plugs and/or conductive contact plugs. The conductive features of the interconnect structure 102 form electrical connections to the device elements formed in or on the semiconductor substrate 100. The device element may be a doped region formed in or over the semiconductor substrate 100. Alternatively, the device element may be a gate electrode formed over or in the semiconductor substrate 100.

In some embodiments, the various device elements are interconnected to form an integrated circuit device through the conductive features in the interconnect structure 102. The integrated circuit device includes, for example, a light sensing device, a logic device, a memory device (such as static random access memory (SRAM) and/or dynamic static random access memory (DRAM)), radio frequency (RF) device, input/output (I/O) device, system-on-chip (SoC) device, other applicable devices, or a combination thereof.

In some embodiments, the multiple dielectric layers of the interconnect structure 102 are made of or include silicon oxide, silicon nitride, silicon oxynitride, tetraethylorthosilicate (TEOS) oxide, phosphosilicate glass (PSG), borophosphosilicate glass (BPSG), fluorinated silica glass (FSG), carbon doped silicon oxide, amorphous fluorinated carbon, low-k dielectric material, one or more other suitable materials, or a combination thereof. The low-k dielectric material may have a dielectric constant (k value) less than about 3.9 or less than about 2.8. In some embodiments, the conductive features of the interconnect structure 102 are made of or include copper, aluminum, tungsten, cobalt, titanium, nickel, gold, platinum, other suitable materials, or a combination thereof. The formation of the interconnect structure 102 may involve multiple deposition processes, photolithography processes, etching processes, planarization processes, one or more other applicable processes, or a combination thereof.

Figure 3B:
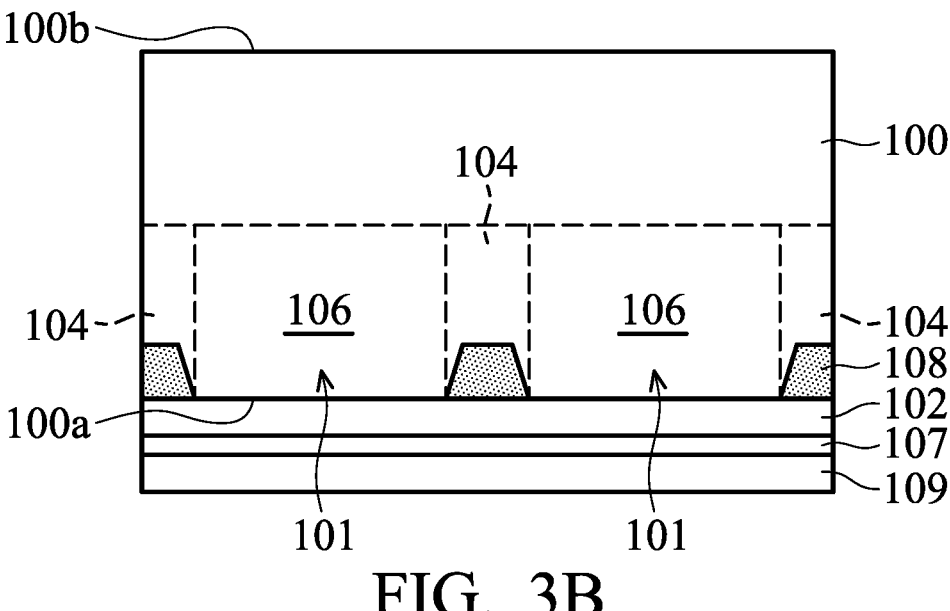

As shown in FIG. 3B, the structure shown in FIG. 3A is bonded onto a carrier substrate 109, in accordance with some embodiments. In some embodiments, an adhesion layer 107 is used to bond the interconnect structure 102 with the carrier substrate 109. In some embodiments, the carrier substrate 109 is made of or includes a semiconductor material, a dielectric material, a metal material, one or more other suitable materials, or a combination thereof. In some embodiments, the adhesion layer 107 is not formed. The carrier substrate 109 is directly bonded onto the interconnect structure 102. In some other embodiments, the carrier substrate 109 is a semiconductor wafer that contains multiple active devices and/or passive devices.

Figure 3C:
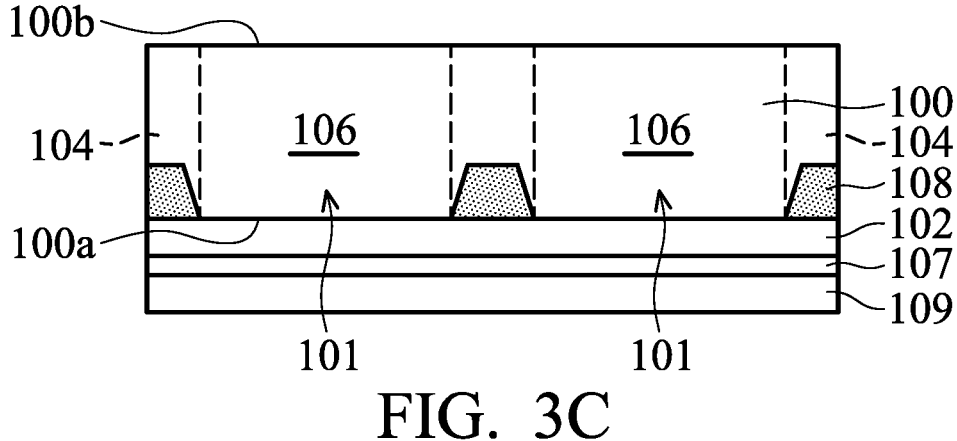

As shown in FIG. 3C, the semiconductor substrate 100 is thinned, in accordance with some embodiments. In some embodiments, the carrier substrate 109 is used as a support, and a thinning process is applied on the back surface 100b of the semiconductor substrate 100 to thin the semiconductor substrate 100. In some embodiments, the thinning process includes a chemical mechanical polishing (CMP) process, a grinding process, an etching process, a dry polishing process, one or more other applicable processes, or a combination thereof.

However, many variations and/or modifications can be made to embodiments of the disclosure. In some other embodiments, the semiconductor substrate 100 is not thinned. In some embodiments, the carrier substrate 109 is not bonded with the interconnect structure 102.

Many variations and/or modifications can be made to embodiments of the disclosure. In some embodiments, portions of the isolation regions 104 are removed from the back surface 100b to form trenches after the thinning of the semiconductor substrate 100. Afterwards, isolation features (such as DTI features) are formed in the trenches to improve electrical isolation between the neighboring light sensing regions 106.

Figure 3D:
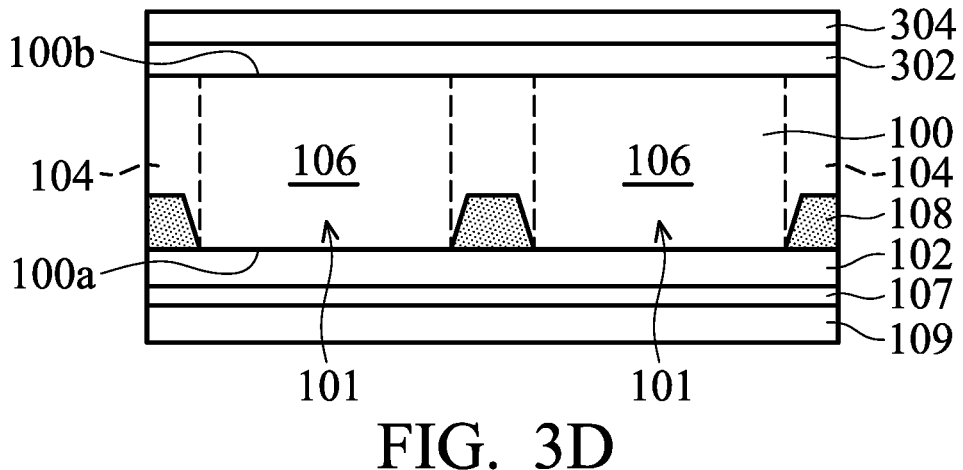

As shown in FIG. 3D, an anti-reflection coating (ARC) layer 302 and a buffer layer 304 are formed over the back surface 100b of the semiconductor substrate 100, in accordance with some embodiments. The ARC layer 302 may be used to reduce optical reflection from the back surface 100b of the semiconductor substrate 100 to ensure that most of an incident light enters the light sensing regions 106 and is sensed.

The ARC layer 302 may be made of or include a high-k material, a dielectric material, one or more other suitable materials, or a combination thereof. The high-k material may include hafnium oxide, tantalum oxide, zirconium oxide, aluminum oxide, one or more other suitable materials, or a combination thereof. The dielectric material includes, for example, silicon nitride, silicon oxynitride, one or more other suitable materials, or a combination thereof.

The buffer layer 304 may be used as a buffer between the ARC layer 302 and an overlying layer subsequently formed. The buffer layer 304 may be made of a dielectric material or one or more other suitable materials. For example, the buffer layer 304 is made of or includes silicon oxide, silicon nitride, silicon oxynitride, one or more other suitable materials, or a combination thereof.

The ARC layer 302 and the buffer layer 304 may together be used as a planarization layer to facilitate subsequent processing. The ARC layer 302 and the buffer layer 304 may be deposited sequentially over the semiconductor substrate 100 using a chemical vapor deposition (CVD) process, a spin-on process, a physical vapor deposition (PVD) process, one or more other applicable processes, or a combination thereof.

Many variations and/or modifications can be made to embodiments of the disclosure. In some embodiments, the ARC layer 302 is not formed. In some other embodiments, the buffer layer 304 is not formed. In some other embodiments, both the ARC layer 302 and the buffer layer 304 are not formed.

Figure 3E:
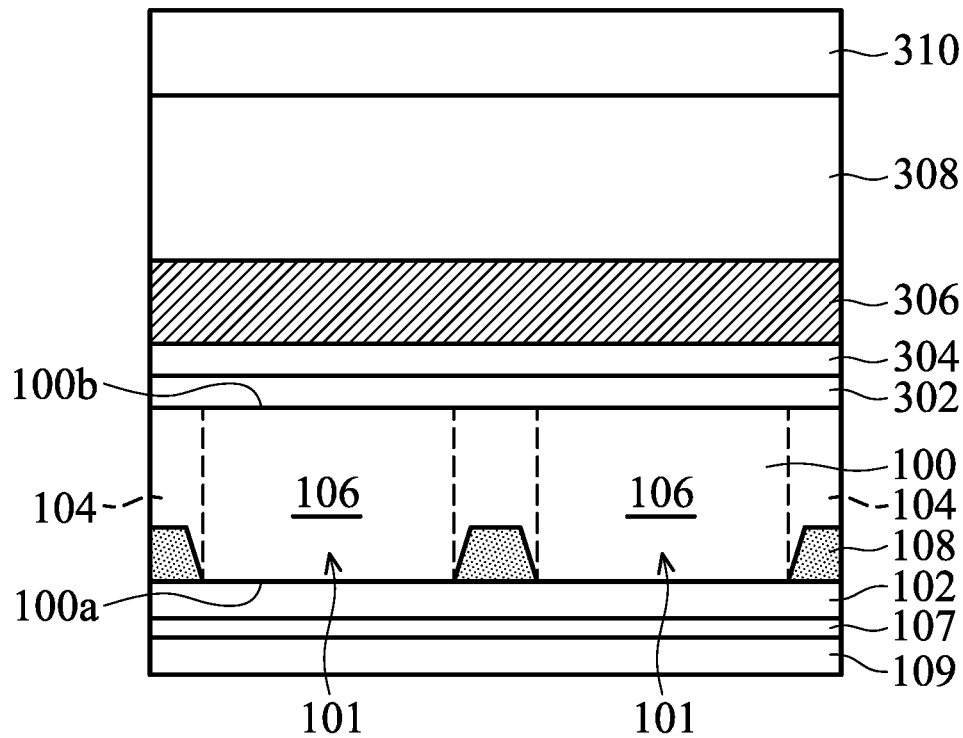

As shown in FIG. 3E, a light shielding layer 306 is deposited over the buffer layer 304, in accordance with some embodiments. The light shielding layer 306 may be used to reflect and/or absorb an incident light. Therefore, the incident light is blocked from penetrating through the light shielding layer 306. In some embodiments, the light shielding layer 306 is configured to completely block the incident light. The transmittance of the light shielding layer 306 may be in a range from about 0 to about 0.20.

In some embodiments, the light shielding layer 306 is used as a light reflective layer. In some embodiments, the light shielding layer 306 is made of or includes a metal material. In some embodiments, the light shielding layer 306 is made of or includes aluminum, silver, copper, titanium, gold, platinum, tungsten, cobalt, tantalum, tantalum nitride, one or more other suitable materials, or a combination thereof. In some embodiments, the light shielding layer 306 is a single layer.

Many variations and/or modifications can be made to embodiments of the disclosure. In some other embodiments, the light shielding layer 306 is made of a semiconductor material. The semiconductor material may have high absorption of visible (and/or infrared) light. For example, the light shielding layer 306 may be made of or include black silicon or other suitable semiconductor materials. The black silicon may include a needle-shaped surface structure where needles are made of single-crystal or polycrystal silicon. In some other embodiments, the light shielding layer 306 may be made of a polymer material or a ceramic material capable of reflecting and/or absorbing the incident light.

In some other embodiments, the light shielding layer 306 includes a stack of multiple sub-layers. In some embodiments, these sub-layers are made of the same material. In some other embodiments, one or more of the sub-layers are made of a material different from that of other sub-layers. In some embodiments, each of the sub-layers is made of a different material.

In some embodiments, the light shielding layer 306 is deposited using a suitable deposition process. The suitable process includes, for example, a PVD process, an electroplating process, a CVD process, an electroless plating process, a spin-on process, one or more other applicable processes, or a combination thereof.

Afterwards, a dielectric layer 308 is deposited over the light shielding layer 306, as shown in FIG. 3E in accordance with some embodiments. In some embodiments, the dielectric layer 308 is in direct contact with the light shielding layer 306. However, in some other embodiments, the dielectric layer 308 is not in direct contact with the light shielding layer 306. One or more other material layers may be formed between the light shielding layer 306 and the dielectric layer 308. In some embodiments, the dielectric layer 308 is thicker than the light shielding layer 306, as shown in FIG. 3E.

In some embodiments, the dielectric layer 308 is a transparent layer. In some embodiments, the dielectric layer 308 is made of or includes silicon oxide, silicon nitride, silicon oxynitride, one or more other suitable materials, or a combination thereof. The dielectric layer 308 may be deposited using a CVD process, a spin-on process, a PVD process, one or more other applicable processes, or a combination thereof.

Afterwards, a dielectric layer 310 is deposited over the dielectric layer 308, as shown in FIG. 3E in accordance with some embodiments. In some embodiments, the dielectric layer 310 is used as an anti-reflection layer, which facilitates subsequent photolithography processes. In some embodiments, the dielectric layer 310 is in direct contact with the dielectric layer 308. However, in some other embodiments, the dielectric layer 310 is not in direct contact with the dielectric layer 308. One or more other material layers may be formed between the dielectric layer 308 and the dielectric layer 310. In some embodiments, the dielectric layer 310 is thinner than the dielectric layer 308, as shown in FIG. 3E. In some embodiments, the dielectric layer 310 is thinner than the light shielding layer 306.

In some embodiments, the dielectric layer 310 is made of a different material than the dielectric layer 308. In some embodiments, the dielectric layer 310 is made of or includes silicon oxynitride, silicon nitride, one or more other suitable materials, or a combination thereof. The dielectric layer 310 may be deposited using a CVD process, a spin-on process, a PVD process, one or more other applicable processes, or a combination thereof.

Many variations and/or modifications can be made to embodiments of the disclosure. In some embodiments, the dielectric layer 310 is not formed.

Figure 3F:
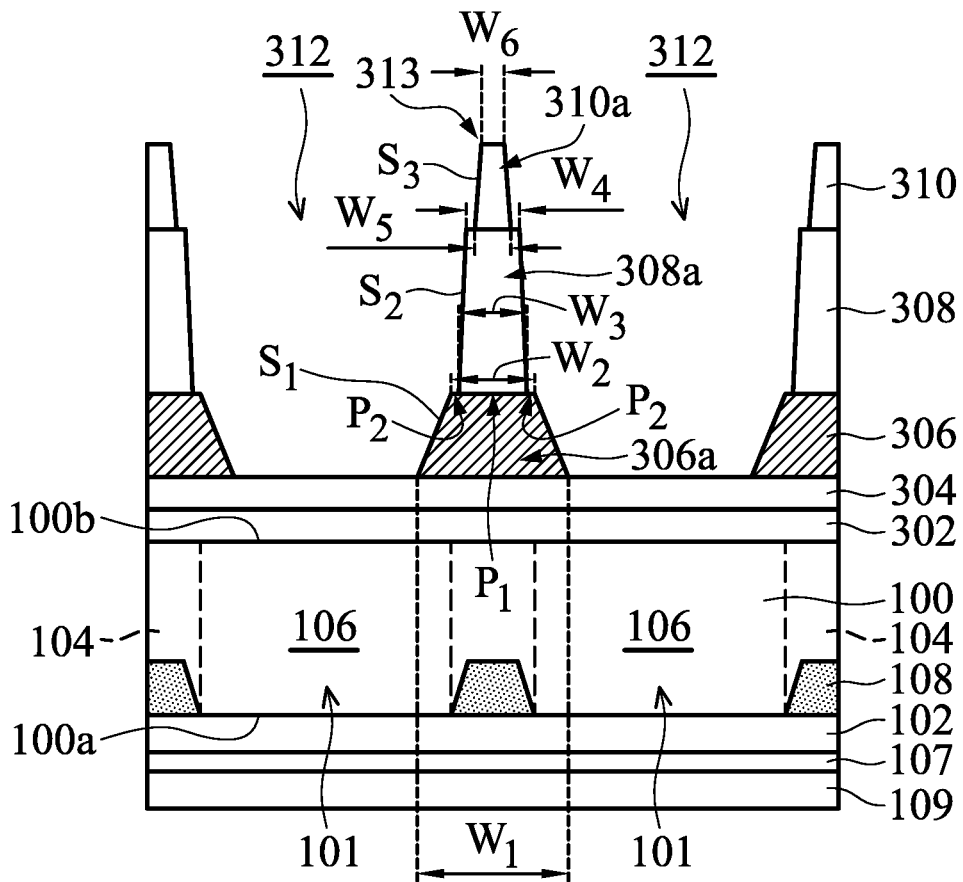

As shown in FIG. 3F, the dielectric layers 310 and 308 and the light shielding layer 306 are partially removed to form recesses 312, in accordance with some embodiments. In some embodiments, each of the recesses 312 is substantially aligned with a corresponding light sensing region 106. The recesses 312 may be used to contain filter elements that will be formed later.

Figure 9:
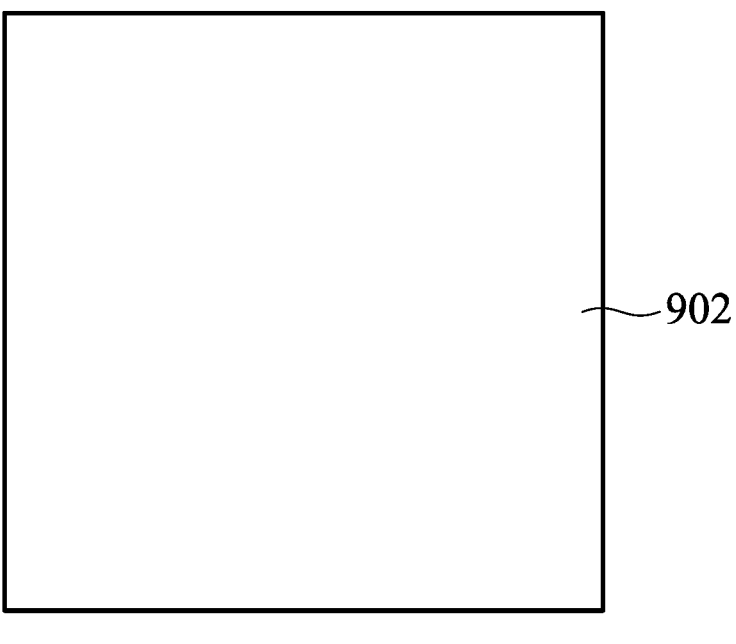
FIG. 9 shows a processing chamber for performing an etching process in a formation process of a light sensing device, in accordance with some embodiments.

In some embodiments, a photolithography process and an etching process are used to partially remove the dielectric layers 310 and 308 and the light shielding layer 306 for forming the recesses 312. A patterned photoresist layer may be formed over the dielectric layer 310 to assist in subsequent patterning processes. FIG. 9 shows a processing chamber 902 for performing an etching process, in accordance with some embodiments. In some embodiments, the dielectric layers 310 and 308 and the light shielding layer 306 are transferred into the processing chamber 902 to perform the etching process. In some embodiments, the dielectric layers 310 and 308 and the light shielding layer 306 are simultaneously etched in the same processing chamber 902 to form the recesses 312. The etching process may include a dry etching process, a wet etching process, or a combination thereof. In some embodiments, the composition of the reaction gases in the processing chamber 902 is varied during the etching process to control the profile of the recesses 312.

After the formation of the recesses 312, the remaining portions of the light shielding layer 306 form a light shielding element 306a. In some embodiments, the light shielding element 306a is a light reflective element. The remaining portions of the dielectric layers 308 and 310 form a dielectric element 308a and a dielectric element 310a, respectively. The light shielding element 306a and the dielectric elements 308a and 310a together form a confinement grid 313. The confinement grid 313 defines the multiple recesses 312 which are used to contain filter elements that will be formed.

As shown in FIG. 3F, the light shielding element 306a has a bottom width $W_1$ and a top width $W_2$. The bottom width $W_1$ may be a line width of a bottom surface of the light shielding element 306a. The top width $W_2$ may be a line width of a top surface of the light shielding element 306a. In some embodiments, the bottom width $W_1$ is greater than the top width $W_2$ of the light shielding element 306a. In some embodiments, the light shielding element 306a becomes narrower along a direction from the bottom surface of the light shielding element 306a towards the dielectric element 308a. In some other embodiments, the light shielding element 306a gradually becomes narrower along a direction from the bottom surface of the light shielding element 306a towards the dielectric element 308a, as shown in FIG. 3F. In some embodiments, the light shielding element 306a has a slanted sidewall surface $S_1$.

As shown in FIG. 3F, the dielectric element 308a has a bottom width $W_3$ and a top width $W_4$. The bottom width $W_3$ may be a line width of a bottom surface of the dielectric element 308a. The top width $W_4$ may be a line width of a top surface of the dielectric element 308a. In some embodiments, the bottom width $W_3$ is greater than the top width $W_4$ of the dielectric element 308a. In some embodiments, the dielectric element 308a becomes wider along a direction from the top surface of the dielectric element 308a towards the light shielding element 306a. In some other embodiments, the dielectric element 308a gradually becomes wider along a direction from the top surface of the dielectric element 308a towards the light shielding element 306a, as shown in FIG. 3F. In some embodiments, the top width $W_2$ of the light shielding element 306a is greater than the bottom width $W_3$ of the dielectric element 308a. In some embodiments, the ratio ($W_3/W_2$) of the width $W_3$ to the width $W_2$ is in a range from about 0.7 to about 0.98. In some other embodiments, the width ratio ($W_3/W_2$) is in a range from about 0.75 to about 0.95.

In some embodiments, the dielectric element 308a has a slanted sidewall surface $S_2$. In some embodiments, the slanted sidewall surface $S_1$ of the light shielding element 306a is not parallel to the slanted sidewall surface $S_2$ of the dielectric element 308a. However, many variations and/or modifications can be made to embodiments of the disclosure. In some other embodiments, the slanted sidewall surface $S_1$ is substantially parallel to the slanted sidewall surface $S_2$.

As shown in FIG. 3F, the top surface of the light shielding element 306a (or light reflective element) has an inner portion $P_1$ and an outer portion $P_2$. In some embodiments, the outer portion $P_2$ surrounds the inner portion $P_1$. In some embodiments, the entirety of the bottom surface of the dielectric element 308a is in direct contact with the inner portion $P_1$ of the top surface of the light shielding element 306a.

As shown in FIG. 3F, the dielectric element 310a has a bottom width $W_5$ and a top width $W_6$. The bottom width $W_5$ may be a line width of a bottom surface of the dielectric element 310a. The top width $W_6$ may be a line width of a top surface of the dielectric element 310a. In some embodiments, the bottom width $W_5$ is greater than the top width $W_6$ of the dielectric element 310a. In some embodiments, the dielectric element 310a becomes wider along a direction from the top surface of the dielectric element 310a towards the dielectric element 308a. In some other embodiments, the dielectric element 310a gradually becomes wider along a direction from the top surface of the dielectric element 310a towards the dielectric element 308a, as shown in FIG. 3F. In some embodiments, the top width $W_4$ of the dielectric element 308a is greater than the bottom width $W_5$ of the dielectric element 310a.

In some embodiments, the dielectric element 310a has a slanted sidewall surface $S_3$. In some embodiments, the slanted sidewall surface $S_1$ of the light shielding element 306a is not parallel to the slanted sidewall surface $S_3$ of the dielectric element 310a. However, many variations and/or modifications can be made to embodiments of the disclosure. In some other embodiments, the slanted sidewall surface $S_1$ is substantially parallel to the slanted sidewall surface $S_3$. In some embodiments, the slanted sidewall surface $S_2$ is substantially parallel to the slanted sidewall surface $S_3$. In some other embodiments, the slanted sidewall surface $S_2$ is not parallel to the slanted sidewall surface $S_3$.

Figure 3G:
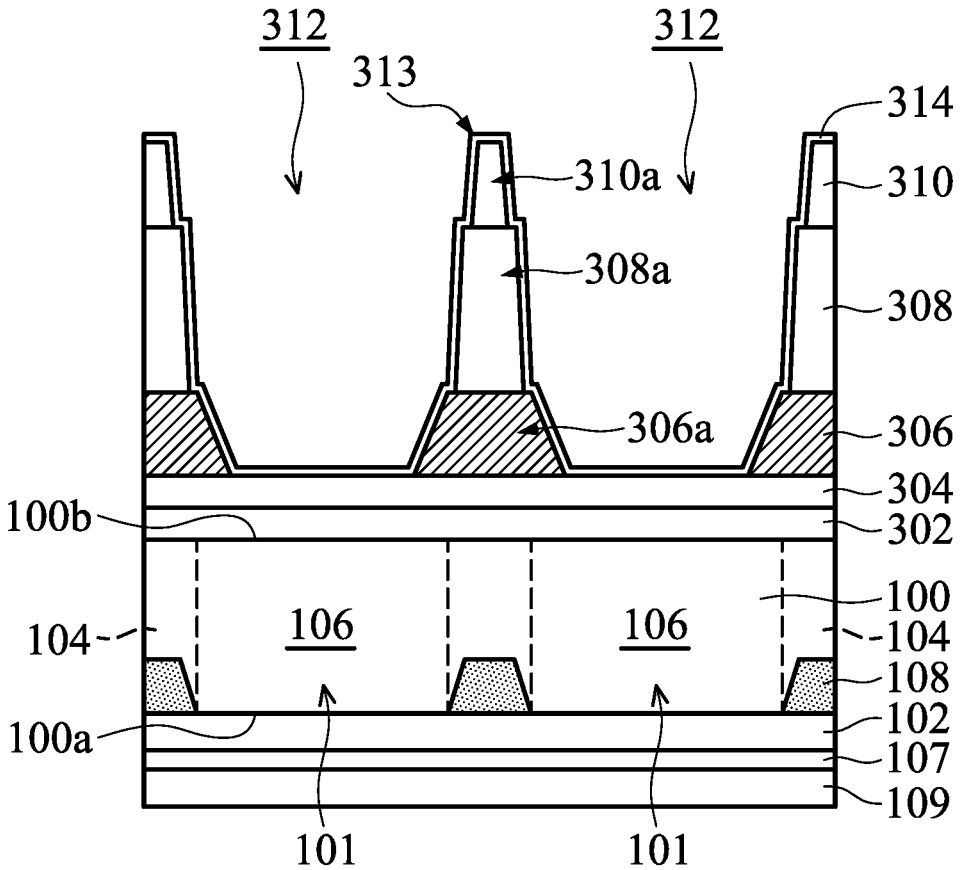

As shown in FIG. 3G, a passivation layer 314 is formed over sidewalls and bottoms of the recesses 312, in accordance with some embodiments. In some embodiments, the passivation layer 314 covers the sidewalls and top surface of the confinement grid 313. In some embodiments, the passivation layer 314 is in direct contact with the confinement element 313. In some embodiments, the passivation layer 314 is in direct contact with a top surface of the light shielding element 306a. In some embodiments, the passivation layer 314 and the dielectric element 308a together cover the top surface of the light shielding element 306a. In some embodiments, the passivation layer 314 extends conformally along the sidewall surfaces of the confinement grid 313.

The passivation layer 314 may be made of or include silicon oxide, silicon oxynitride, silicon nitride, silicon carbide, one or more other suitable materials, or a combination thereof. In some other embodiments, the passivation layer 314 is made of or includes one or more polymer materials. The passivation layer 314 may be formed using a CVD process, a spin-on process, a PVD process, one or more other applicable processes, or a combination thereof.

Many variations and/or modifications can be made to embodiments of the disclosure. In some other embodiments, the passivation layer 314 is not formed.

In some embodiments, an upper portion of each of the recesses 312 is wider than a lower portion of each of the recesses 312 due to the profile of the confinement grid 313. The material and/or precursor used for forming the passivation layer 314 may be introduced onto the bottom and sidewall surfaces more easily. Therefore, the formation of the passivation layer 314 is easier to perform, which result in good adhesion between the passivation layer 314 and the confinement grid 313.

Figure 3H:
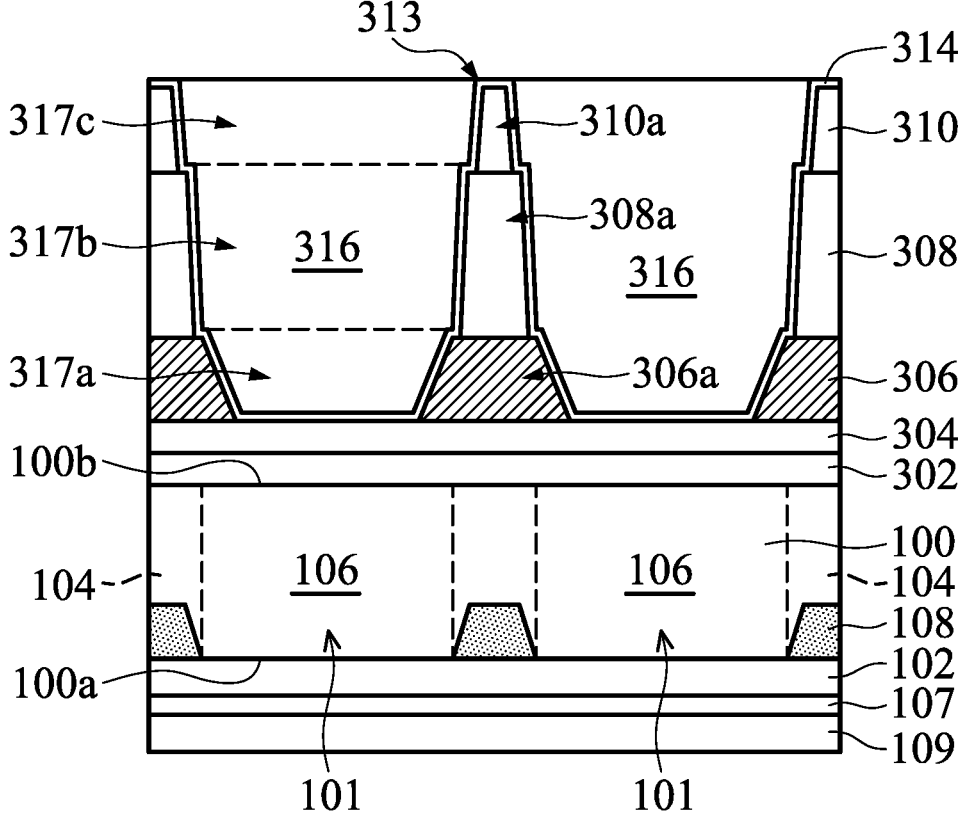

As shown in FIG. 3H, filter elements 316 are formed in the recesses 312 defined by the confinement grid 313, in accordance with some embodiments. In some embodiments, the filter elements 316 are correspondingly aligned with the light sensing regions 106, as shown in FIG. 3H. The filter elements 316 may be color filter elements. In some embodiments, the neighboring filter elements 316 may have different colors. The filter elements 316 may be made of or include a dye-based polymer (or a pigment-based polymer).

In some embodiments, a filter film is formed over the passivation layer 314 to fill the recesses 312 using, for example, a spin-on process or other applicable processes. The filter film may also be a photo-sensitive layer or a photoresist layer. Therefore, exposure and development operations may then be performed to pattern the filter film such that the filter film remains in some of the recesses 312. The remained portions of the filter film are used as the filter elements 316. In some embodiments, a thermal operation is used to complete the formation of the filter elements 316. The filter film may shrink after the thermal operation. Similarly, the filter elements with different colors may be formed sequentially in some other recesses by using similar methods.

In some embodiments, the passivation layer 314 surrounds the filter elements 316 and is positioned between the filter elements 316 and the light shielding element 306a. The passivation layer 314 may be used to prevent chemical reaction between the shielding element 306a and the filter elements 316.

As shown in FIG. 3H, each of the filter elements 316 has portions 317a, 317b, and 317c. The portion 317a is between the portion 317b and one of the light sensing regions 106. The portion 317b is between the portion 317a and the portion 317c. In some embodiments, the light shielding element 306a is positioned beside the portion 317a. In some embodiments, the portion 317a is surrounded by the light shielding element 306a. In some embodiments, the dielectric element 308a is positioned beside the portion 317b. In some embodiments, the portion 317b is surrounded by the dielectric element 308a. In some embodiments, the dielectric element 310a is positioned beside the portion 317c. In some embodiments, the portion 317c is surrounded by the dielectric element 310a.

As mentioned above, in some embodiments, the adhesion between the passivation layer 314 and the confinement grid 313 is good due to the profile of the confinement grid 313. Therefore, voids may be prevented from being formed between the passivation layer 314 and the confinement grid 313. The passivation layer 314 may have a suitable surface for the filter elements 316 to be formed on since there is no void. The risk of the filter elements 316 peeling is significantly reduced. In some other embodiments where the passivation layer 314 is not formed, the adhesion between the filter elements 316 and the confinement grid 313 is also good due to the profile of the confinement grid 313.

In some other cases, the profile of the confinement grid may not be carefully controlled. For example, the bottom width of the dielectric element 308a may be wider than the light shielding element 306a. That is, the confinement grid has a necking profile which is difficult for the protection layer or the filter film to cover well. The adhesion between the passivation layer and the confinement grid may be difficult to maintain. Poor adhesion between the passivation layer and the confinement grid may cause voids to form between the passivation layer and the confinement grid. The filter elements may peel after the thermal operation, which may negatively affect the performance and quality of the light sensing device.

Figure 6:
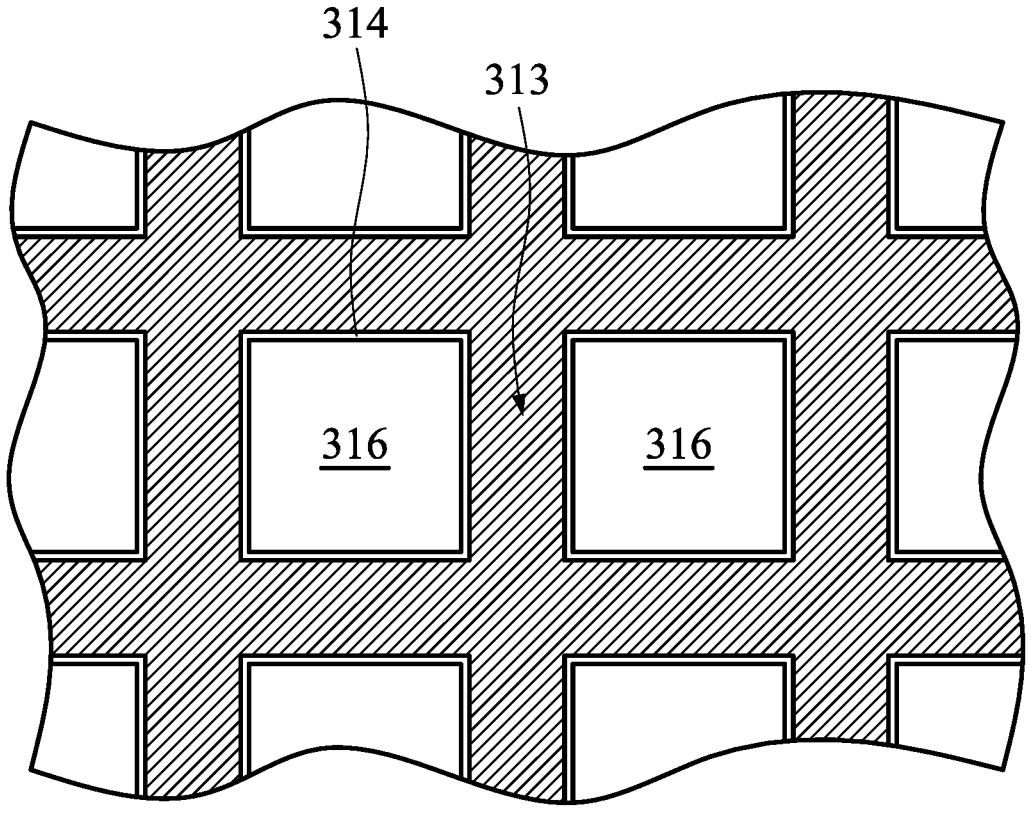
FIG. 6 is a top view of a light sensing device, in accordance with some embodiments.

FIG. 6 is a top view of a light sensing device, in accordance with some embodiments. In some embodiments, FIG. 6 shows the top view of the structure shown in FIG. 3H. In some embodiments, the confinement grid 313 is covered by the passivation layer 314. For clarity, the confinement grid 313 is also shown in FIG. 6. However, embodiments of the disclosure are not limited thereto. In some other embodiments, the portions of the passivation layer 314 outside of the recesses 312 are removed. For example, a planarization process may be used to remove the portions of the passivation layer 314 outside of the recesses 312. The planarization process may include a CMP process, a grinding process, a dry polishing process, an etching process, one or more other applicable processes, or a combination thereof. In these cases, the passivation layer 314 does not cover the top surface of the confinement grid 313.

In some embodiments, each (or some) of the recesses 312 defined by the confinement grid 313 has a square profile or a rectangular profile. Therefore, each of the filter elements 316 formed therein has a square profile or a rectangular profile, as shown in FIG. 6 in accordance with some embodiments.

Many variations and/or modifications can be made to embodiments of the disclosure. In some embodiments, the filter elements 316 have profiles other than that shown in FIG. 6.

Figure 7:
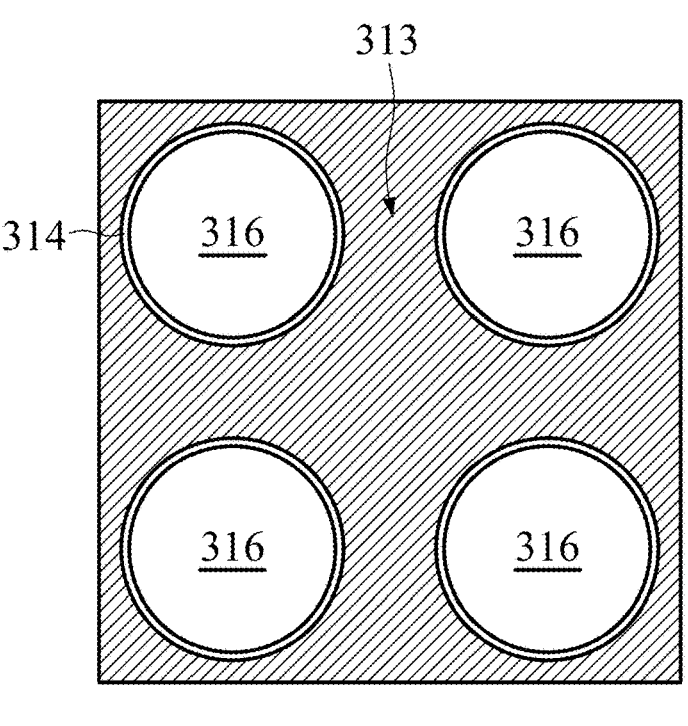
FIG. 7 is a top view of a light sensing device, in accordance with some embodiments.

FIG. 7 is a top view of a light sensing device, in accordance with some embodiments. In some embodiments, FIG. 7 shows the top view of the structure shown in FIG. 3H. In some embodiments, the confinement grid 313 is covered by the passivation layer 314. For clarity, the confinement grid 313 is also shown in FIG. 7. However, embodiments of the disclosure are not limited thereto. In some other embodiments, the portions of the passivation layer 314 outside of the recesses 312 are removed. In some embodiments, each (or some) of the recesses 312 defined by the confinement grid 313 has a circle profile. Therefore, each of the filter elements 316 formed therein has a circle profile, as shown in FIG. 7 in accordance with some embodiments. In some embodiments, because the recesses 312 have circle profiles, shrinkage of the filter film in the recesses 312 are the same along multiple directions during the thermal operation for forming the filter elements 316. The stress in the filter elements 316 is more balanced, resulting in more reliable filter elements 316.

Figure 8:
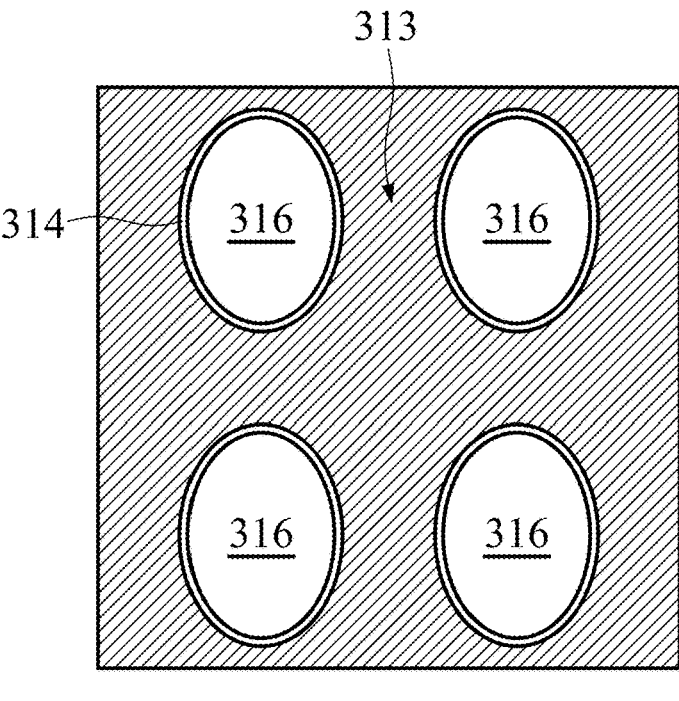
FIG. 8 a top view of a light sensing device, in accordance with some embodiments.

Many variations and/or modifications can be made to embodiments of the disclosure. In some other embodiments, the filter elements 316 have oval profiles, as shown in FIG. 8 in accordance with some embodiments.

Figure 4:
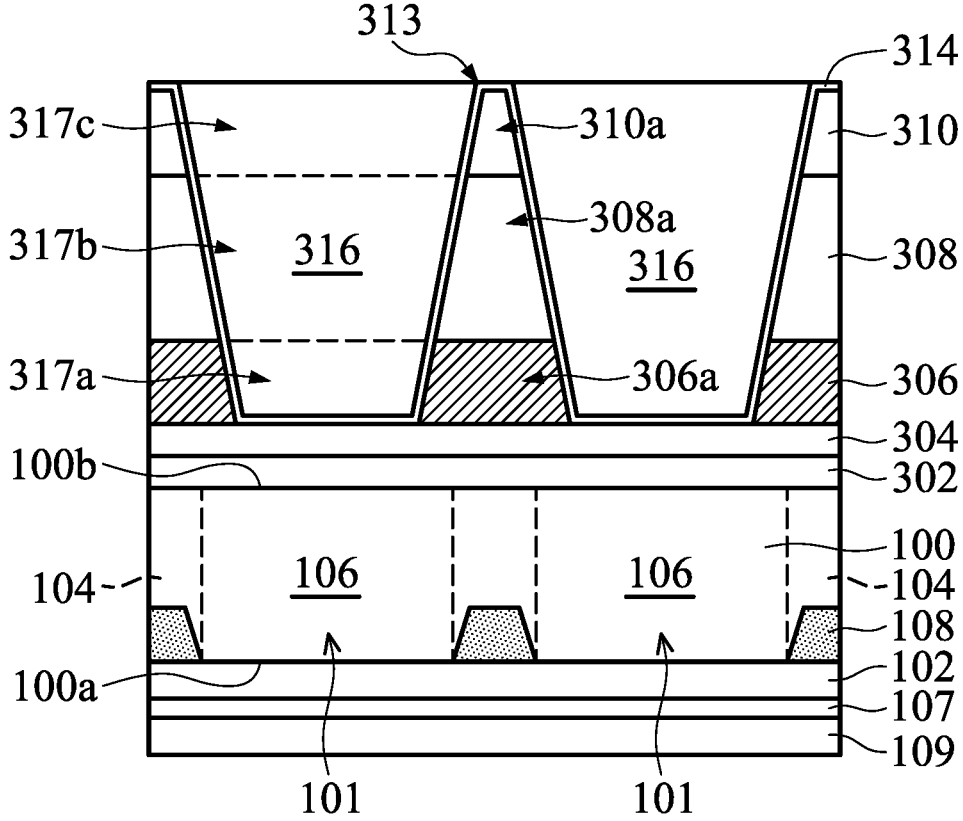
FIG. 4 is a cross-sectional view of a light sensing device, in accordance with some embodiments.

Many variations and/or modifications can be made to embodiments of the disclosure. In some other embodiments, the confinement grid 313 is modified. FIG. 4 is a cross-sectional view of a light sensing device, in accordance with some embodiments. In some embodiments, the top width of the light shielding element 306a is substantially as wide as the bottom width of the dielectric element 308a. In some embodiments, the top width of the dielectric element 308a is substantially as wide as the bottom width of the dielectric element 310a. In some embodiments, the profile of the confinement grid 313 may be controlled through fine-tuning the etching process for forming the recesses 312.

Figure 5:
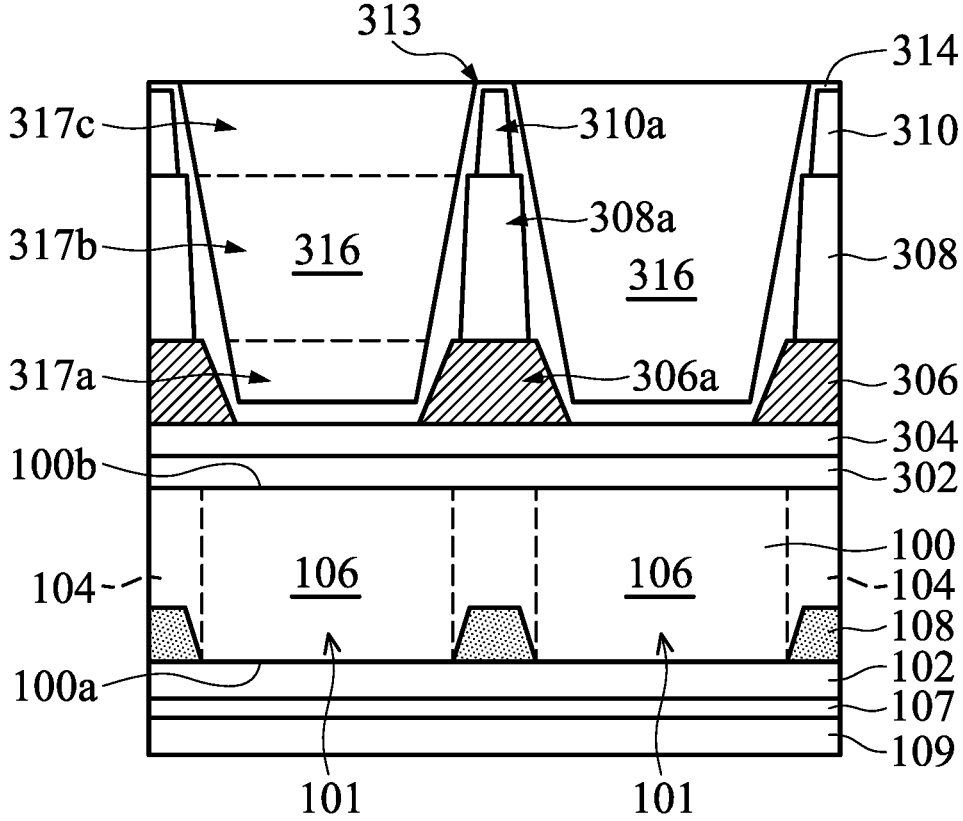
FIG. 5 is a cross-sectional view of a light sensing device, in accordance with some embodiments.

Many variations and/or modifications can be made to embodiments of the disclosure. In some other embodiments, the passivation layer 314 is modified. FIG. 5 is a cross-sectional view of a light sensing device, in accordance with some embodiments. In some embodiments, the passivation layer 314 does not extend conformally along the sidewalls surfaces of the confinement grid 313. In some embodiments, the passivation layer 314 has varied thicknesses. In some embodiments, the passivation layer 314 has slanted sidewall surfaces. The profile of the passivation layer 314 may be controlled through modifying the thickness of the passivation layer 314.

Embodiments of the disclosure form a light sensing device with a confinement grid for containing filter elements. The confinement element includes a light shielding element and a dielectric element above the light shielding element. The top width of the light shielding element is not smaller than the bottom width of the dielectric element. Therefore, a passivation layer formed on the confinement grid has a good adhesion with the confinement grid. There is substantially no void formed between the passivation layer and the confinement grid. Therefore, the passivation layer may have a suitable surface for the filter elements to be formed on. The risk of the filter elements peeling is significantly reduced. The reliability and performance of the light sensing device are significantly improved.

In accordance with some embodiments, a light sensing device is provided. The light sensing device includes a semiconductor substrate and a light sensing region in the semiconductor substrate. The light sensing device also includes a filter element over the semiconductor substrate and aligned with the light sensing region. The filter element has a first portion and a second portion, and the first portion is between the second portion and the light sensing region. The light sensing device further includes a light shielding element over the semiconductor substrate and beside the first portion of the filter element. In addition, the light sensing device includes a dielectric element over the light shielding element and beside the second portion of the filter element. A top width of the light shielding element is greater than a bottom width of the dielectric element.

In accordance with some embodiments, a light sensing device is provided. The light sensing device includes a semiconductor substrate and a light sensing region in the semiconductor substrate. The light sensing device also includes a filter element over the semiconductor substrate and aligned with the light sensing region. The light sensing device further includes a light reflective element over the semiconductor substrate and surrounding a lower portion of the filter element. In addition, the light sensing device includes a dielectric element over the light reflective element and surrounding an upper portion of the filter element. The light sensing device also includes a passivation layer between the filter element and the light reflective element.

In accordance with some embodiments, a method for forming a light sensing device is provided. The method includes forming a light sensing region in a semiconductor substrate and forming a light shielding layer over the semiconductor substrate. The method also includes forming a dielectric layer over the light shielding layer. The method further includes partially removing the light shielding layer and the dielectric layer to form a light shielding element and a dielectric element. A top width of the light shielding element is greater than a bottom width of the dielectric element. The light shielding element and the dielectric element surround a recess, and the recess is aligned with the light sensing region. In addition, the method includes forming a filter element in the recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A light sensing device, comprising:
a semiconductor substrate;
a light sensing region in the semiconductor substrate;
a filter element over the light sensing region, wherein a top view of the filter element has a curved profile;
a light shielding element over the semiconductor substrate and beside the filter element;
a dielectric element over the light shielding element and beside the filter element, wherein a top of the light shielding element and a bottom of the dielectric element have different widths, the bottom of the dielectric element is wider than a top of the dielectric element, and a bottommost surface of the dielectric element is vertically between the top of the dielectric element and a bottom of the light shielding element; and
a passivation layer surrounding the filter element, wherein the passivation layer is between the light shielding element and the filter element, and the passivation layer gradually becomes thinner along a direction from the top of the light shielding element toward the bottom of the light shielding element.

2. The light sensing device as claimed in claim 1, wherein the bottommost surface of the dielectric element is in direct contact with a topmost surface of the light shielding element.

3. The light sensing device as claimed in claim 1, further comprising:
a second dielectric element over the dielectric element and beside the filter element.

4. The light sensing device as claimed in claim 3, wherein a top of the dielectric element and a bottom of the second dielectric element have different widths, and the bottom of the second dielectric element is wider than a top of the second dielectric element.

5. The light sensing device as claimed in claim 3, wherein the second dielectric element is in direct contact with the dielectric element.

6. The light sensing device as claimed in claim 1, wherein the light shielding element comprises a metal material.

7. The light sensing device as claimed in claim 1, wherein the passivation layer has a first slanted sidewall having a first slope, the light shielding element has a second slanted sidewall having a second slope, and the first slope is different from the second slope.

8. The light sensing device as claimed in claim 1, wherein a first sidewall of the light shielding element has a first slope, a second sidewall of the dielectric element has a second slope, and the first slope and the second slope are different from each other.

9. The light sensing device as claimed in claim 1, wherein the dielectric element is thicker than the light shielding element.

10. The light sensing device as claimed in claim 1, further comprising:
an isolation structure beside the light sensing region, wherein a top of the isolation structure is vertically between a bottom of the isolation structure and the light shielding element, the top of the isolation structure is vertically between a top of the light sensing region and a bottom of the light sensing region, and the bottom of the isolation structure and the bottom of the light sensing region are substantially at a same height level.

11. A light sensing device, comprising:

a semiconductor substrate;

a light sensing region in the semiconductor substrate;

a filter element over the light sensing region;

a first dielectric element beside the filter element, wherein a bottom of the first dielectric element is wider than a top of the first dielectric element;

a second dielectric element over the first dielectric element and beside the filter element, wherein the top of the first dielectric element and a bottom of the second dielectric element have different widths, the top of the first dielectric element is wider than a top of the second dielectric element, and the bottom of the second dielectric element is wider than the top of the second dielectric element;

a light reflective element between the first dielectric element and the semiconductor substrate, wherein a top of the light reflective element is wider than the bottom of the first dielectric element;

a passivation layer extending along a sidewall of the light reflective element and the top of the light reflective element, and the passivation layer gradually becomes thicker along an upward direction toward the top of the light reflective element; and an isolation structure beside the light sensing region, wherein a top of the isolation structure is vertically between a bottom of the isolation structure and the light reflective element, and the top of the isolation structure is vertically between a top of the light sensing region and a bottom of the light sensing region.

12. The light sensing device as claimed in claim 11, wherein a first sidewall of the first dielectric element has a first slope, a second sidewall of the second dielectric element has a second slope, and the first slope and the second slope are different from each other.

13. The light sensing device as claimed in claim 11, wherein an upper portion of the filter element and a lower portion of the filter element have different widths.

14. The light sensing device as claimed in claim 11, wherein an entirety of the bottom of the first dielectric element is in direct contact with the light reflective element.

15. The light sensing device as claimed in claim 11, wherein the light reflective element extends across opposite edges of the isolation structure.

16. A light sensing device, comprising:

a substrate;

a filter element over the substrate, wherein a top view of the filter element has a circular profile or an oval profile;

a first dielectric element beside the filter element, wherein a bottom of the first dielectric element is wider than a top of the first dielectric element;

a second dielectric element over the first dielectric element and beside the filter element, wherein a first sidewall of the first dielectric element has a first slope, a second sidewall of the second dielectric element has a second slope, a top of the second dielectric element and a bottom of the second dielectric element have different widths, and the first slope and the second slope are different from each other;

a metal element between the first dielectric element and the substrate, wherein a top of the metal element extends across opposite edges of a bottom of the first dielectric element; and a passivation layer extending along a sidewall of the metal element and the top of the metal element, the passivation layer has a first portion beside the top of the metal element and a second portion between the first portion and the substrate, and the first portion is thicker than the second portion.

17. The light sensing device as claimed in claim 16, wherein a bottom of the filter element is closer to the substrate than the bottom of the first dielectric element.

18. The light sensing device as claimed in claim 16, wherein a third sidewall of the metal element has a third slope, and the third slope and the first slope are different from each other.

19. The light sensing device as claimed in claim 16, wherein the passivation layer further extends along the first sidewall and the second sidewall, and the passivation layer has a slanted sidewall having a third slope, and the third slope is different from the first slope and the second slope.

20. The light sensing device as claimed in claim 16, further comprising:

an isolation structure beside the light sensing region, wherein a top of the isolation structure is vertically between a bottom of the isolation structure and the metal element, and the top of the isolation structure is vertically between a top of the light sensing region and a bottom of the light sensing region; and an interconnection structure extending across opposite edges of the filter element, wherein the isolation structure is positioned between the interconnection structure and the metal element.

* * * * *